(12) United States Patent
Chuang et al.

(10) Patent No.: US 10,943,991 B2
(45) Date of Patent: Mar. 9, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wei-Chih Chuang, Tainan (TW); Chia-Jong Liu, Ping-Tung County (TW); Kuang-Hsiu Chen, Tainan (TW); Chung-Ting Huang, Kaohsiung (TW); Chi-Hsuan Tang, Kaohsiung (TW); Kai-Hsiang Wang, Taichung (TW); Bing-Yang Jiang, Tainan (TW); Yu-Lin Cheng, Changhua County (TW); Chun-Jen Chen, Tainan (TW); Yu-Shu Lin, Pingtung County (TW); Jhong-Yi Huang, Nantou County (TW); Chao-Nan Chen, Tainan (TW); Guan-Ying Wu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/294,877

(22) Filed: Mar. 6, 2019

(65) Prior Publication Data

US 2020/0243664 A1 Jul. 30, 2020

(30) Foreign Application Priority Data

Jan. 30, 2019 (TW) ................................ 108103436

(51) Int. Cl.
*H01L 29/66* (2006.01)
*H01L 29/423* (2006.01)

(52) U.S. Cl.
CPC .... *H01L 29/6656* (2013.01); *H01L 29/42364* (2013.01)

(58) Field of Classification Search
CPC .......... H01L 29/6656; H01L 29/42364; H01L 29/7848; H01L 29/0847; H01L 29/42324; H01L 29/4234; H01L 29/0653; H01L 29/66636; H01L 29/66628
See application file for complete search history.

(56) References Cited

U.S. PATENT DOCUMENTS

| 2013/0126949 A1* | 5/2013 | Liao ...................... H01L 29/045 257/288 |
| 2015/0017777 A1* | 1/2015 | Chang ................. H01L 29/7847 438/305 |
| 2015/0021696 A1* | 1/2015 | Sung ...................... H01L 29/165 257/368 |
| 2015/0200299 A1* | 7/2015 | Chen ................. H01L 29/66636 257/192 |

(Continued)

*Primary Examiner* — Galina G Yushina
(74) *Attorney, Agent, or Firm* — Winston Hsu

(57) ABSTRACT

A semiconductor device and a method for fabricating the semiconductor device are provided, in which the method includes the steps of forming a gate structure on a substrate, forming a spacer on a sidewall of the gate structure, forming two recesses adjacent to two sides of the spacer, performing a cleaning process to trim the spacer for forming a void between the spacer and the substrate, and forming two portions of an epitaxial layer in the two recesses. The semiconductor device preferably includes a cap layer on the two portions of the epitaxial layer as the cap layer includes a planar top surface and an inclined sidewall.

8 Claims, 4 Drawing Sheets

(56) References Cited

U.S. PATENT DOCUMENTS

| | | | |
|---|---|---|---|
| 2015/0236158 A1* | 8/2015 | Chang | H01L 21/02579 |
| | | | 257/190 |
| 2016/0056261 A1* | 2/2016 | Thees | H01L 29/6656 |
| | | | 257/288 |
| 2018/0033866 A1* | 2/2018 | Liao | H01L 21/28123 |
| 2018/0337280 A1* | 11/2018 | Zhao | H01L 29/7848 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of using cleaning process to form void between spacer and substrate.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

Current approach of forming MOS transistor having epitaxial layer is usually achieved by removing part of the interlayer dielectric (ILD) layer to form contact hole after forming an epitaxial layer, and then depositing metals into the contact hole to form a contact plug. This order however easily damages the surface of the epitaxial layer and affects the performance of the device substantially. Hence, how to improve the current fabrication to resolve this issue has become an important task in this field.

SUMMARY OF THE INVENTION

According to an embodiment of the present invention, a method for fabricating semiconductor device includes the steps off forming a gate structure on a substrate, forming a spacer on a sidewall of the gate structure, forming two recesses adjacent to two sides of the spacer, performing a cleaning process to trim the spacer for forming a void between the spacer and the substrate, and forming two portions of an epitaxial layer in the two recesses.

According to another aspect of the present invention, a semiconductor device includes: a gate structure on a substrate; two portions of an epitaxial layer adjacent to two sides of the gate structure; and a cap layer on the epitaxial layer, wherein the cap layer comprises a planar top surface and an inclined sidewall.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
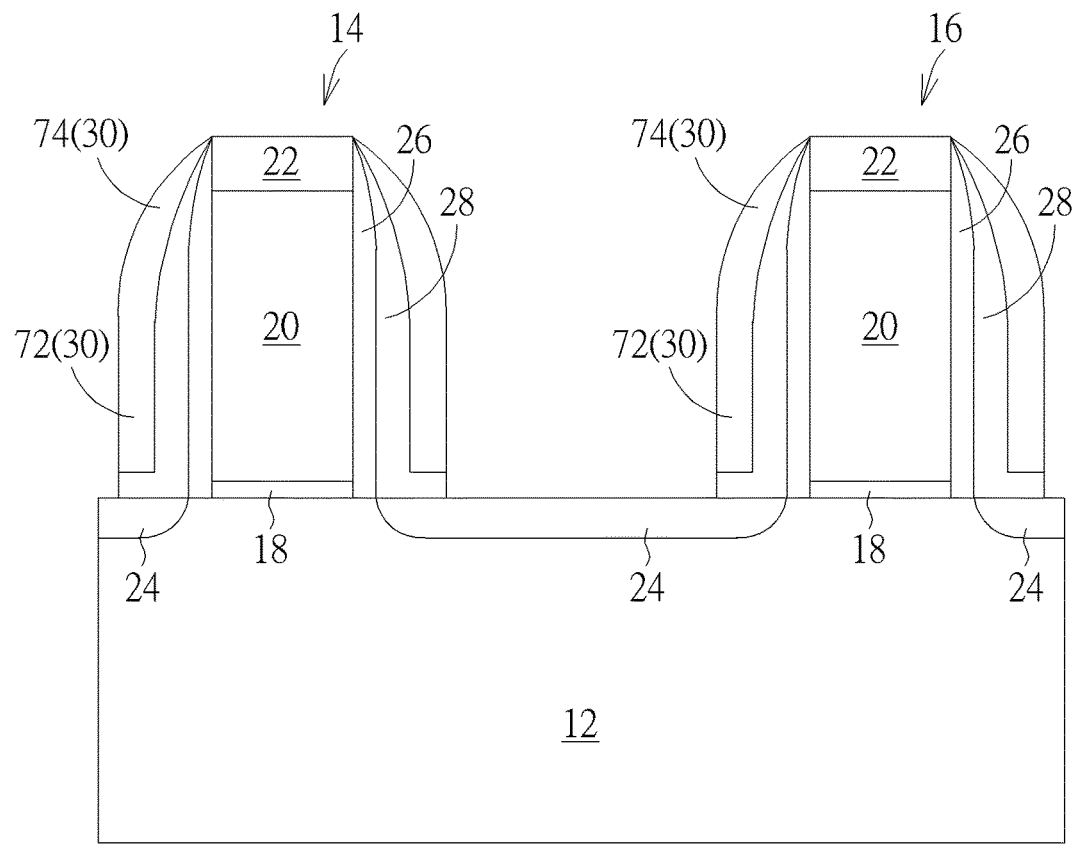
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12 is provided, and gate structures 14 and 16 are formed on the substrate 12. In this embodiment, the formation of the gate structures 14 and 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and stripping the patterned resist. This forms gate structures 14 and 16 on the substrate 12, in which each of the gate structures 14 and 16 includes a patterned gate dielectric layer 18, patterned gate material layer 20, and patterned hard mask 22. It should be noted that to emphasize the formation of epitaxial layer between the two gate structures 14 and 16 in the later process, only two gate structures 14 and 16 are presented in this embodiment and only a partial view of the gate structures 14 and 16, in particular the portion between the two gate structures 14, 16 is shown in FIG. 1.

In this embodiment, the substrate 12 could be a semiconductor substrate such as a silicon substrate, an epitaxial substrate, a silicon carbide (SiC) substrate, or a silicon-on-insulator (SOI) substrate, but not limited thereto. The gate dielectric layer 18 could include silicon oxide ($SiO_2$), silicon nitride (SiN), or high-k dielectric material; the gate material layer 20 could include metal, polysilicon, or silicide; the material of hard mask 22 could be selected from the group consisting of $SiO_2$, SiN, SiC, and SiON.

According to an embodiment of the present invention, a plurality of doped wells or shallow trench isolations (STIs) could be selectively formed in the substrate 12. Despite the present invention pertains to a planar MOS transistor, it would also be desirable to apply the process of the present invention to non-planar transistors, such as FinFET devices, and in such instance, the substrate 12 shown in FIG. 1 would be a fin-shaped structure formed atop a substrate 12.

Next, at least one spacer is formed on sidewalls of each of the gate structures 14 and 16, and an optional lightly doped ion implantation processes is conducted along with a rapid thermal annealing processes performed at about 930° C. to active the dopants implanted in the substrate 12. This forms lightly doped drains 24 in the substrate 12 adjacent to two sides of the spacers. In this embodiment, the spacer formed on sidewalls of each of the gate structures 14, 16 is preferably a composite spacer further including a spacer 26 disposed or directly contacting sidewalls of the gate structures 14, 16 or gate electrodes, a spacer 28 disposed on sidewalls of the spacer 26, and a spacer 30 disposed on sidewalls of the spacer 28, in which the innermost spacer 26 includes an I-shape cross-section, the middle spacer 28 includes a L-shape cross-section, and the outermost spacer 30 includes a lower portion 72 with an I-shape cross-section and an upper portion 74 with a half-arc shape. In this embodiment, the innermost spacer 26 and the middle spacer 28 could be made of same material or different materials, the innermost spacer 26 and the outermost spacer 30 could be made of same material or different material, and all three spacers 26, 28, 30 could include silicon oxide ($SiO_2$), silicon nitride (SiN), silicon oxynitride (SiON), silicon carbon nitride (SiCN), or combination thereof. The middle spacer 28 and the outermost spacer 30 on the other hand are preferably made of different materials, in which the middle spacer 28 in this embodiment is preferably made of silicon oxide while the outermost spacer 30 is made of silicon nitride.

Figure 2:
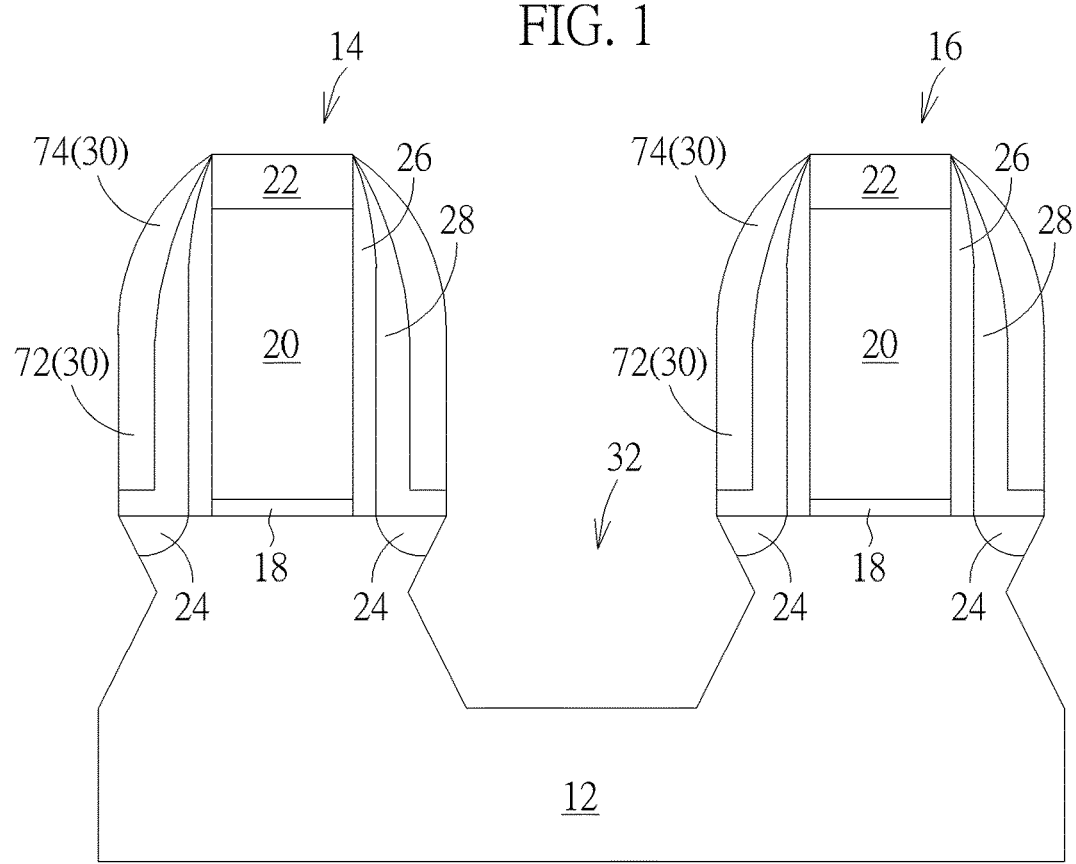

Next, as shown in FIG. 2, an etching process is conducted to form two recesses 32 in the substrate 12 adjacent to two sides of the spacers 30. Preferably, the etching process could be accomplished by first conducting a dry etching process to form initial recesses (not shown) in the substrate 12 adjacent to two sides of the gate structures 14, 16, and then conducting a wet etching process to expand the recesses isotropically for forming the recesses 32. According to an embodiment of the present invention, the wet etching process could be accomplished using etchant including but not limited to for example ammonium hydroxide (NH$_4$OH) or tetramethylammonium hydroxide (TMAH). It should be noted that the formation of the recesses 32 is not limited to the combination of dry etching process and wet etching process addressed previously. Instead, the recesses 32 could also be formed by single or multiple dry etching and/or wet etching processes, which are all within the scope of the present invention. According to an embodiment of the present invention, the recesses 32 could have various cross-section shapes, including but not limited to for example a circle, a hexagon, or an octagon. Despite the cross-section of the recesses 32 in this embodiment pertains to be a hexagon, it would also be desirable to form the recesses 32 with aforementioned shapes, which are all within the scope of the present invention.

Figure 3:
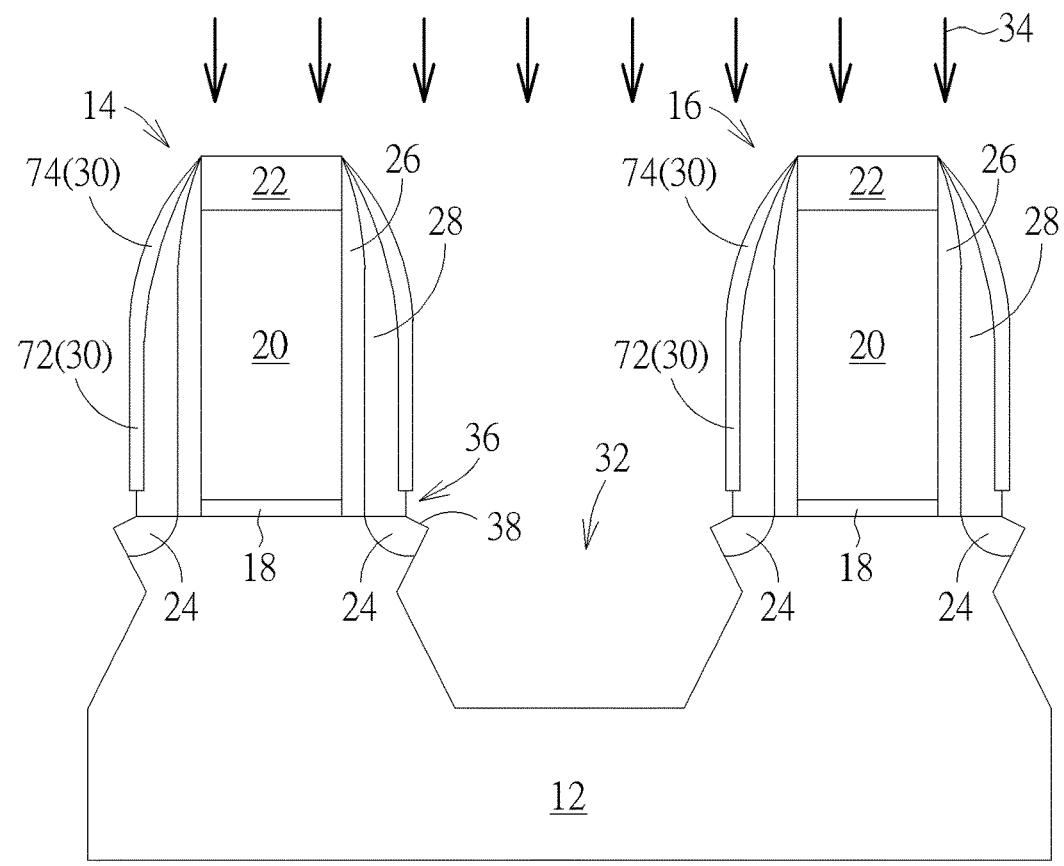

Next, as shown in FIG. 3, a cleaning process 34 is conducted to trim the outermost spacer 30 and at the same time forming a void 36 between the spacers 28, 30 and the substrate 12. Viewing from a more detailed perspective, the cleaning process 34 preferably removes part of the outermost spacer 30 and part of the middle spacer 28 at the same time so that the thickness of the spacer 30 is slightly reduced while the horizontal portion of the L-shape spacer 28 is retracted inward or even the overall shape of the spacer 28 is transformed from an L-shape cross-section to an I-shape cross-section. This forms a void 36 between the spacers 28, 30 and the substrate 12. In other words, the outer sidewall of the outermost spacer 30 is preferably not aligned to the outer sidewall of the middle spacer 28 after the cleaning process 34 while the spacer 30 could be standing on or not standing on the middle spacer 28 depending on the shape of the spacer 28. For instance as shown in FIG. 3, if the horizontal portion of the L-shape spacer 28 in the middle is slightly retracted while still maintaining the L-shape cross-section the outer spacer 30 would still standing on the horizontal portion of the L-shape spacer 28. Nevertheless, if the L-shape spacer 28 in the middle is transformed into an I-shape spacer during the cleaning process 34, the inner sidewall of the outermost spacer 30 would then be aligned to the outer sidewall of the middle spacer 28.

It should also be noted that the cleaning process 34 conducted at this stage not only trims the outermost spacer 30 but also removes part of the substrate 12 surface directly contacting the L-shape spacer 28. Preferably, the planar surface of the substrate 12 which was parallel to the bottom surface of the gate structures 14, 16 is partially removed during the cleaning process 34 to form at least an inclined surface 38, in which an angle included by the inclined surface 38 and the top surface of the substrate 12 (or more specifically the surface contacted by the bottom of the spacer 28 and the substrate 12) is greater than 90 degrees but less than 180 degrees. In this embodiment, the etchant used in the cleaning process 34 could include but not limited to for example diluted hydrofluoric acid (dHF) and/or TMAH.

Figure 4:
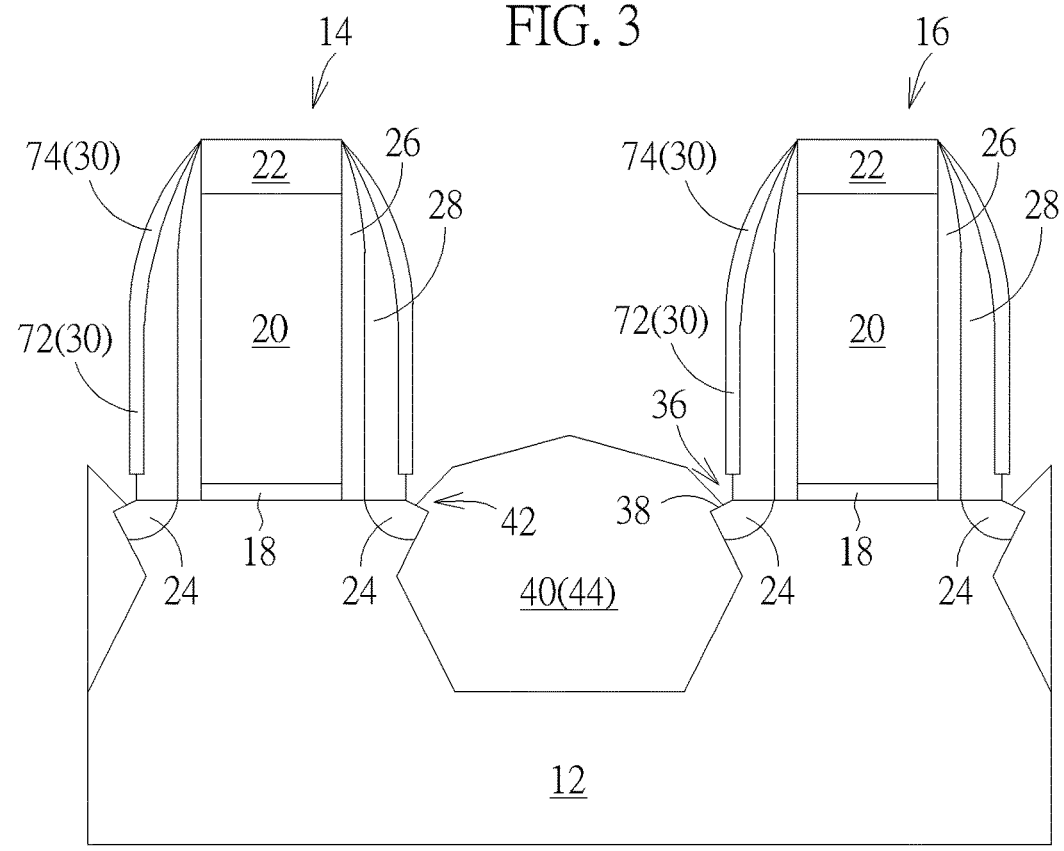

Next, as shown in FIG. 4, a selective epitaxial growth (SEG) process is conducted to form selective buffer layers (not shown) and two portions of an epitaxial layer 40 in the recesses 32. In this embodiment, the epitaxial layer 40 preferably includes a hexagon shaped cross-section, a top surface of the epitaxial layer 40 is slightly higher than a top surface of the substrate 12, and sidewalls of the epitaxial layer 40 preferably include protrusion or protruding portions 42 at the aforementioned inclined surface 38, in which the protruding portions 42 are extending toward the gate structures 14, 16 adjacent to two sides of the epitaxial layer 40.

In this embodiment, the epitaxial layer 40 could also be formed to include different material depending on the type of transistor being fabricated. For instance, if the MOS transistor being fabricated were to be a PMOS transistor, the epitaxial layer 40 could be made of material including but not limited to for example SiGe, SiGeB, or SiGeSn. If the MOS transistor being fabricated were to be a NMOS transistor, the epitaxial layer 40 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layer 40 is preferred to have less or no germanium atom at all to facilitate the formation of silicide afterwards.

Next, an ion implantation process is conducted to form source/drain regions 44 in part or the entire epitaxial layer 40. According to an embodiment of the present invention, the source/drain regions 44 could also be formed insituly during the SEG process. For instance, the source/drain regions 44 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain region. Moreover, the dopants within the source/drain regions 44 could also be formed with a gradient, which is also within the scope of the present invention.

Figure 5:
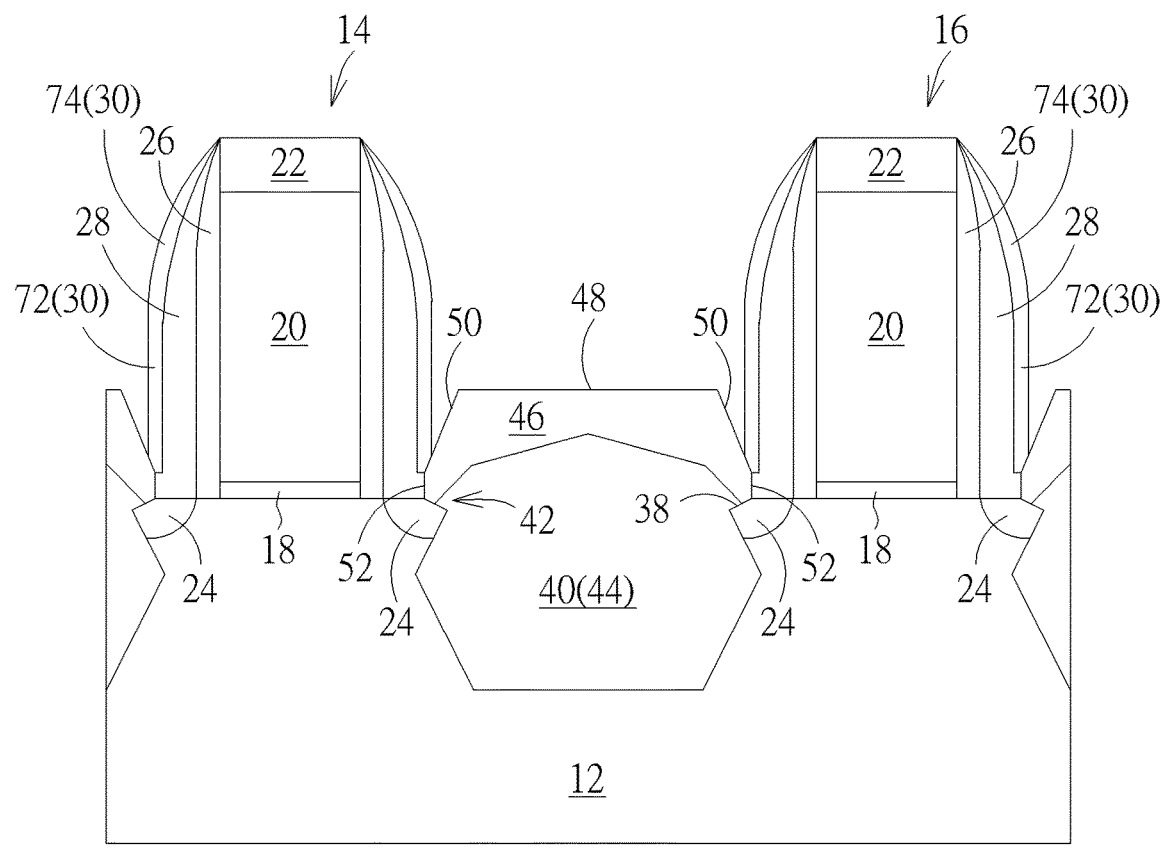

Next, as shown in FIG. 5, a cap layer 46 is formed on the epitaxial layer 40 to fill the voids 36 completely. It should be noted that the cap layer 46 made of pure silicon is preferably grown upward along the sidewalls of the spacer 28 made from silicon oxide until reaching a heterogeneous surface such as the spacer 30 made from silicon nitride. Upon reaching the spacer 30 the growth of the cap layer 46 then turns another direction until forming a final cap layer 46 composed of a planar top surface 48 preferably coplanar with the bottom surface of the gate structures 14, 16, two inclined sidewalls 50 connected to the planar top surface 48, and two vertical sidewalls 52 contacting the spacers 28 and connected to the inclined sidewalls 50 at the same time. By following the aforementioned approach, it would be desirable to increase protection for the cap layer 46 and lower the capacitance overlap ($C_{ov}$) for the device.

Figure 6:
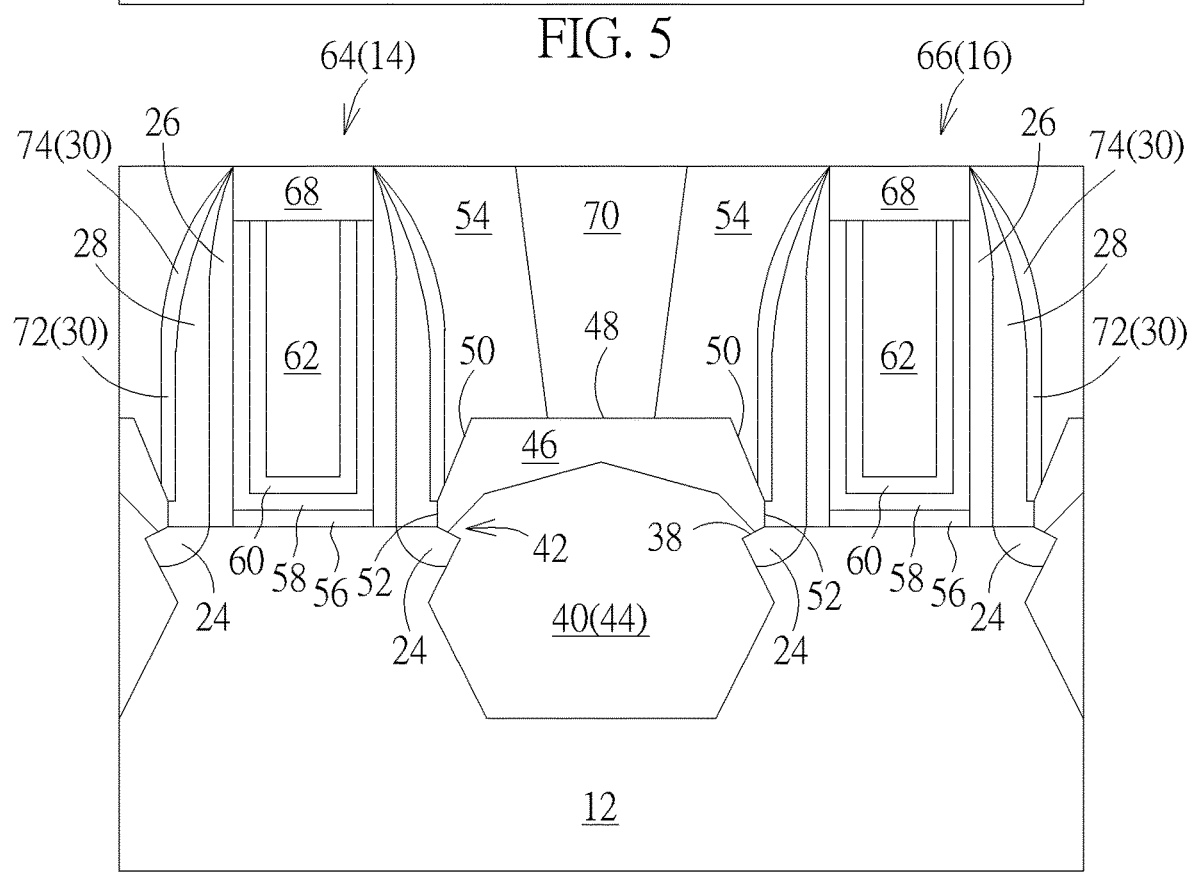

Next, as shown in FIG. 6, a contact etch stop layer (CESL) (not shown) and an interlayer dielectric (ILD) layer 54 are formed on the gate structure 14, 16, and a planarizing process such as chemical mechanical polishing (CMP) process is conducted to remove part of the ILD layer 54 and part of the CESL to expose hard masks 22 so that the top surfaces of the hard masks 22 and ILD layer 54 are coplanar.

Next, a replacement metal gate (RMG) process is conducted to transform the gate structures 14, 16 into metal gates. For instance, the RMG process could be accomplished by first performing a selective dry etching or wet etching process, such as using etchants including but not limited to for example ammonium hydroxide ($NH_4OH$) or tetramethylammonium hydroxide (TMAH) to remove the hard masks 22, gate material layer 20 and even gate dielectric layer 18 from gate structures 14, 16 for forming recesses (not shown) in the ILD layer 54. Next, a selective interfacial layer 56 or gate dielectric layer, a high-k dielectric layer 58, a work function metal layer 60, and a low resistance metal layer 62 are formed in the recesses, and a planarizing process such as CMP is conducted to remove part of low resistance metal layer 62, part of work function metal layer 60, and part of high-k dielectric layer 58 to form gate structures 14, 16 made from metal gates 64, 66. In this embodiment, each of the gate structures 14, 16 or metal gates fabricated through high-k last process of a gate last process preferably includes an interfacial layer 56 or gate dielectric layer (not shown), a U-shaped high-k dielectric layer 58, a U-shaped work function metal layer 60, and a low resistance metal layer 62.

In this embodiment, the high-k dielectric layer 58 is preferably selected from dielectric materials having dielectric constant (k value) larger than 4. For instance, the high-k dielectric layer 58 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 60 is formed for tuning the work function of the metal gate in accordance with the conductivity of the device. For an NMOS transistor, the work function metal layer 60 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 60 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 60 and the low resistance metal layer 62, in which the material of the barrier layer may include titanium (Ti), titanium nitride (TiN), tantalum (Ta) or tantalum nitride (TaN). Furthermore, the material of the low-resistance metal layer 62 may include copper (Cu), aluminum (Al), titanium aluminum (TiAl), cobalt tungsten phosphide (CoWP) or any combination thereof.

Next, part of the high-k dielectric layer 58, part of the work function metal layer 60, and part of the low resistance metal layer 62 are removed to form recesses (not shown), an hard masks 68 are then formed into the recesses so that the top surfaces of the hard masks 68 and ILD layer 54 are coplanar. The hard masks 68 could be made of material including but not limited to for example $SiO_2$, SiN, SiON, SiCN, or combination thereof.

Next, a contact plug formation could be conducted to form contact plugs 70 electrically connected to the source/drain regions 44. In this embodiment, the formation of contact plugs 70 could be accomplished by removing part of the ILD layer 54 and part of the CESL to form contact holes (not shown), and then depositing a barrier layer (not shown) and a metal layer (not shown) into the contact holes. A planarizing process, such as CMP is then conducted to remove part of the metal layer, part of the barrier layer, and even part of the ILD layer 54 to form contact plugs 70, in which the top surface of the contact plugs 70 is even with the top surface of the ILD layer 54. In this embodiment, the barrier layer is selected from the group consisting of Ti, Ta, TiN, TaN, and WN, and the metal layer is selected from the group consisting of Al, Ti, Ta, W, Nb, Mo, and Cu.

Figure 7:
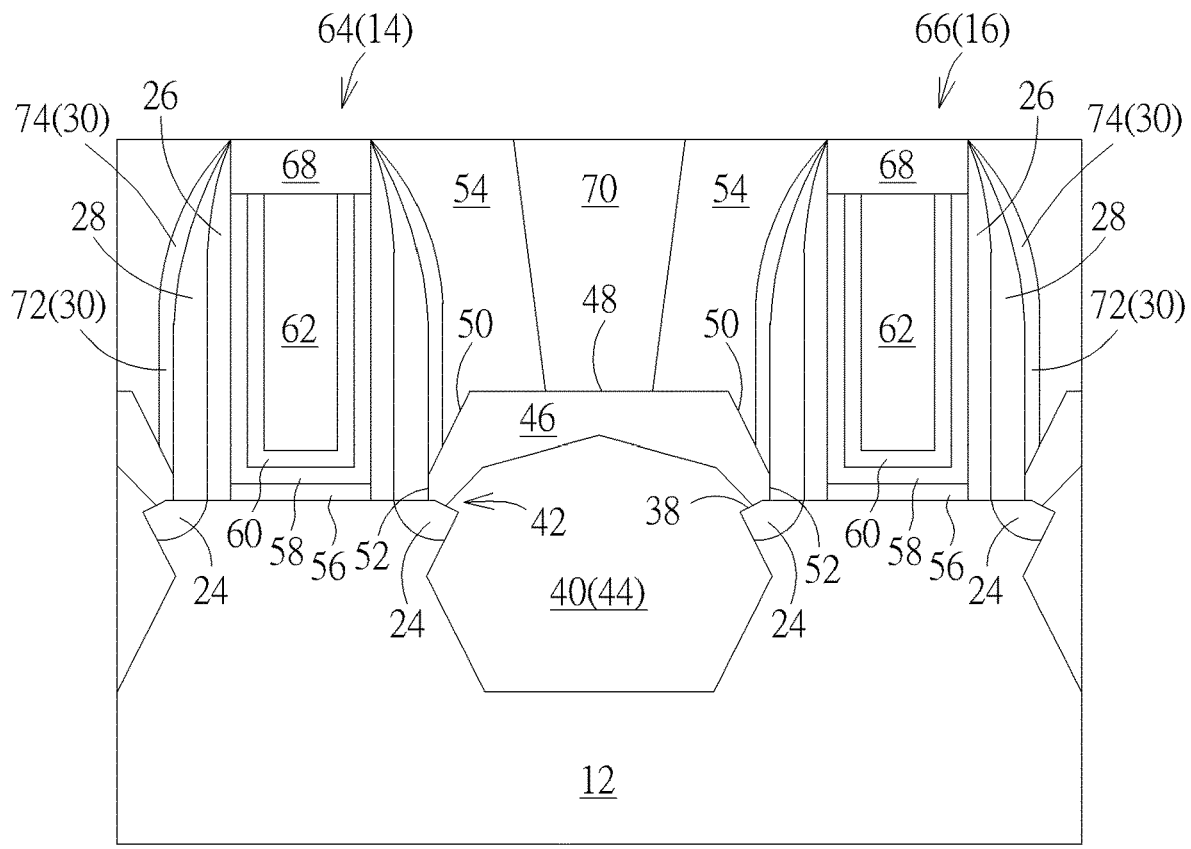
FIG. 7 illustrates a structural view of a semiconductor device according to an embodiment of the present invention.

Referring again to FIGS. 6-7, FIGS. 6-7 illustrate structural views of a semiconductor device according to different embodiments of the present invention. As shown in FIGS. 6-7, the semiconductor device preferably includes gate structures 14, 16 disposed on the substrate 12, spacers 26 disposed adjacent to the gate structures 14, 16, spacers 28 disposed on the sidewalls of the spacers 26, and spacers 30 disposed on the sidewalls of the spacers 28, epitaxial layers 40 disposed adjacent to two sides of the gate structures 14, 16, and a cap layer 46 disposed on each of the epitaxial layers 40.

Viewing from a more detailed perspective, the spacer 26 shown in FIG. 6 preferably includes an I-shape cross-section, the spacer 28 includes a L-shape cross-section, and the spacer 30 includes a lower portion 72 with an I-shape cross-section and an upper portion 74 with a half-arc shape, in which the bottom or more specifically bottommost surface of the spacer 30 is higher than the bottom or bottommost surface of the spacers 26, 28 while the bottommost surfaces of the spacers 26, 28 are even with the bottom surface of the gate structures 14, 16. It should be noted that even though the middle spacer 28 includes an L-shape cross-section in this embodiment, according to another embodiment as shown in FIG. 7, the middle spacer 28 could also include an I-shape cross-section as the adjacent spacers 26, 30 and in such instance, the inner sidewall of the outermost spacer 30 would be aligned with the outer sidewall of the middle spacer 28, the spacer 30 preferably not sitting on the spacer 28, and the bottommost surface of the spacer 30 is still higher than the bottommost surface of the spacer 28.

Preferably, the three spacers 26, 28, 30 are made of different materials, in which the middle spacer 28 is preferably made of silicon oxide, the outermost spacer 30 is made of silicon nitride, and the innermost spacer 26 could be made from $SiO_2$, SiN, SiON, or SiCN depending on the demand of the product.

Moreover, the top or more specifically topmost surface of the epitaxial layer 40 is preferably higher than the top surface of the substrate 12 and sidewalls of the epitaxial layer 40 preferably include protruding portions 42 on the inclined surface 38 of the substrate 12, in which the protruding portions 42 and sidewalls of the epitaxial layer 40 together constitute jagged pattern as the protruding portions 42 extend toward the gate structures 14, 16 and away from the epitaxial layer 40. The cap layer 46 disposed on top of the epitaxial layer 40 preferably includes a planar top surface 48 parallel to the top surface of the substrate 12 or bottom surface of the gate structures 14, 16, two inclined sidewalls 50 connected to the planar top surface 48, and two vertical sidewalls 52 directly contacting the spacers 28 and connected to the two inclined sidewalls 50. Since the cap layer 46 is extended into lower portions of the spacer 30, part of the cap layer 46 preferably contacts the spacers 28, 30 directly. In contrast to the two vertical sidewalls 52 not aligning the sidewalls of the spacers 28, 30 as shown in FIG. 6, the two vertical sidewalls 52 of the cap layer 46 shown in FIG. 7 are preferably aligned to the outer sidewalls of the spacers 28.

Figure 8:
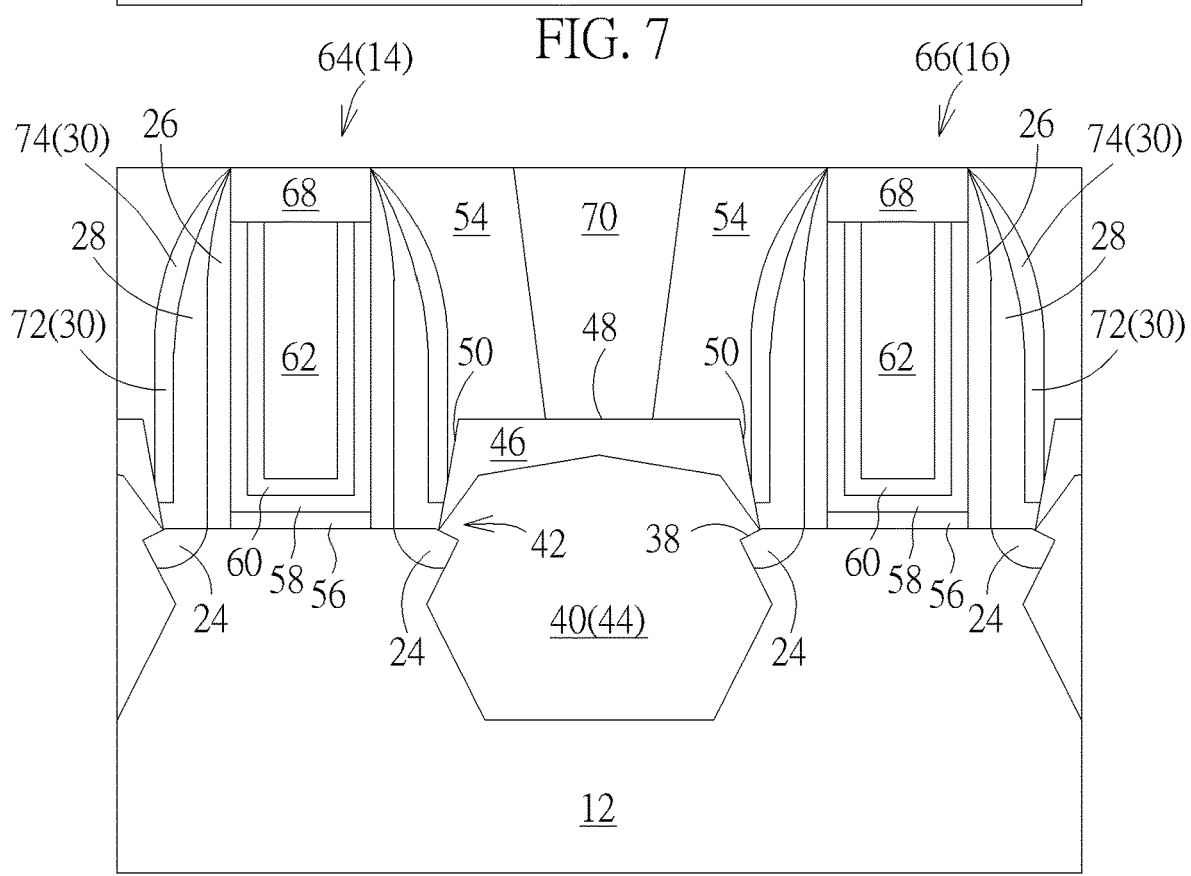
FIG. 8 illustrates a structural view of a semiconductor device according to an embodiment of the present invention.

Referring to FIG. 8, FIG. 8 illustrates a structural view of a semiconductor device according to an embodiment of the present invention. As shown in FIG. 8, in contrast to the cap layer 46 in the aforementioned embodiment includes a planar top surface 48, two inclined sidewalls 50 connected to the planar top surface 48, and two vertical sidewalls 52 contacting the spacers 28, it would be desirable to adjust the volume of reacting gas injected or recipe to form a cap layer 46 only having a planar top surface 48 and two inclined sidewalls 50 connected to the planar top surface 48 while the two inclined sidewalls 50 contact the spacers 28 directly. By doing so it would be desirable to further reduce the overall volume of the cap layer 46 and lower dopant concentration such as boron concentration in the cap layer 46 so that capacitance overlap ($C_{ov}$) of the device could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a gate structure on a substrate;
a first spacer on a sidewall of the gate structure;
a second spacer on a sidewall of the first spacer;
a third spacer on a sidewall of the second spacer; and
first and second stacks of an epitaxial layer and a cap layer respectively disposed at first and second sides of the gate structure, wherein the cap layer comprises a planar top surface and an inclined sidewall, the cap layer contacts the second spacer and the third spacer directly, and the cap layer comprises a vertical sidewall connected to the inclined sidewall.

2. The semiconductor device of claim 1, wherein the first spacer comprises an I-shape, the second spacer comprises an L-shape, and the third spacer comprises a lower portion with an I-shape and an upper portion with a half-arc shape.

3. The semiconductor device of claim 2, wherein a bottom surface of the third spacer is higher than a bottom surface of the second spacer.

4. The semiconductor device of claim 2, wherein bottom surfaces of the first spacer and the gate structure are coplanar.

5. The semiconductor device of claim 2, wherein bottom surfaces of the second spacer and the gate structure are coplanar.

6. The semiconductor device of claim 1, wherein the first spacer comprises silicon oxide and the second spacer comprises silicon nitride.

7. The semiconductor device of claim 1, wherein the cap layer comprises silicon.

8. A semiconductor device, comprising:
a gate structure on a substrate;
a first spacer on a sidewall of the gate structure;
a second spacer on a sidewall of the first spacer;
a third spacer on a sidewall of the second spacer;
first and second stacks of an epitaxial layer and a cap layer respectively disposed at first and second sides of the gate structure, wherein the cap layer comprises a planar top surface, an inclined sidewall, and a vertical sidewall connected to the inclined sidewall.

* * * * *